US008587954B2

United States Patent
Hsieh et al.

(10) Patent No.: US 8,587,954 B2
(45) Date of Patent: Nov. 19, 2013

(54) ELECTRONIC DEVICE

(75) Inventors: Chung-Cheng Hsieh, New Taipei (TW); Li-Ping Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 236 days.

(21) Appl. No.: 13/186,378

(22) Filed: Jul. 19, 2011

(65) Prior Publication Data

US 2012/0134124 A1 May 31, 2012

(30) Foreign Application Priority Data

Nov. 30, 2010 (TW) .............................. 99141582 A

(51) Int. Cl.
*H05K 5/00* (2006.01)
*H05K 7/02* (2006.01)
*H05K 7/10* (2006.01)

(52) U.S. Cl.
USPC ........... 361/759; 361/807; 361/808; 361/809; 361/810

(58) Field of Classification Search
USPC ...... 361/800, 807, 808, 809, 810; 174/138 E, 174/138 G
See application file for complete search history.

(56) References Cited

U.S. PATENT DOCUMENTS

| | | | |
|---|---|---|---|
| 6,084,774 A * | 7/2000 | Talbot et al. | 361/704 |
| 7,028,389 B2 * | 4/2006 | Chang | 29/739 |
| 7,034,223 B2 * | 4/2006 | Fan et al. | 174/51 |
| 7,385,830 B2 * | 6/2008 | Liu et al. | 361/810 |
| 7,593,239 B2 * | 9/2009 | Li et al. | 361/807 |
| 7,613,012 B2 * | 11/2009 | Hung et al. | 361/809 |
| 7,990,715 B2 * | 8/2011 | Chen | 361/709 |
| 2011/0096516 A1 * | 4/2011 | Li | 361/752 |

* cited by examiner

*Primary Examiner* — Hoa C Nguyen
*Assistant Examiner* — Ahmad D Barnes
(74) *Attorney, Agent, or Firm* — Altis & Wispro Law Group, Inc.

(57) ABSTRACT

An electronic device includes a bottom plate, a circuit board, and a securing assembly. The circuit board is located on the bottom plate. The securing assembly comprises a positioning member, a locking member, and a linking member. The positioning member is mounted to the bottom plate and located between the bottom plate and the circuit board. The locking member is locked to the positioning member, to secure the circuit board to the bottom plate. The linking member is located on the positioning member and connected to the circuit board and the bottom plate to electronically connect the circuit board to the bottom plate.

18 Claims, 6 Drawing Sheets

ELECTRONIC DEVICE

BACKGROUND

1. Technical Field

The present disclosure relates to an electronic device with a circuit board.

2. Description of Related Art

Motherboards are often secured to a bottom plate of a computer chassis by a first locking member and a second locking member. The first locking member defines a threaded hole and is mounted to the bottom plate. The second locking member is externally threaded and screwed into the threaded hole, to secure the motherboard to the bottom plate. Usually, the material of the first locking member is plastic, and the first locking member is capable of elastically deforming to engage with or disengaged from the bottom plate. However, the first locking member is dielectric, and can affect the electronic connection (grounding) between the circuit board and the bottom plate.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
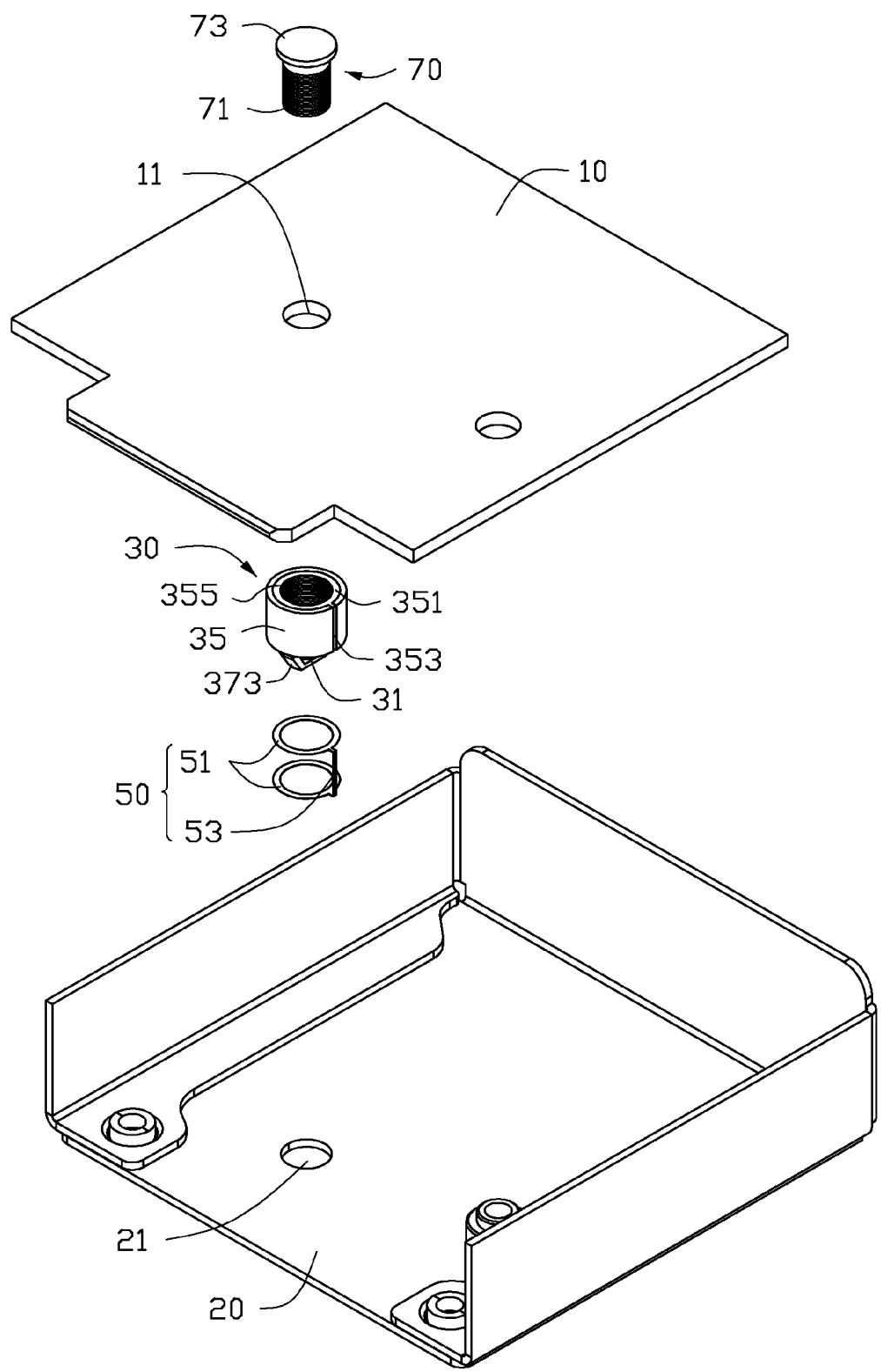
FIG. 1 is an exploded, isometric view of an electronic device in accordance with an embodiment.
Figure 2:
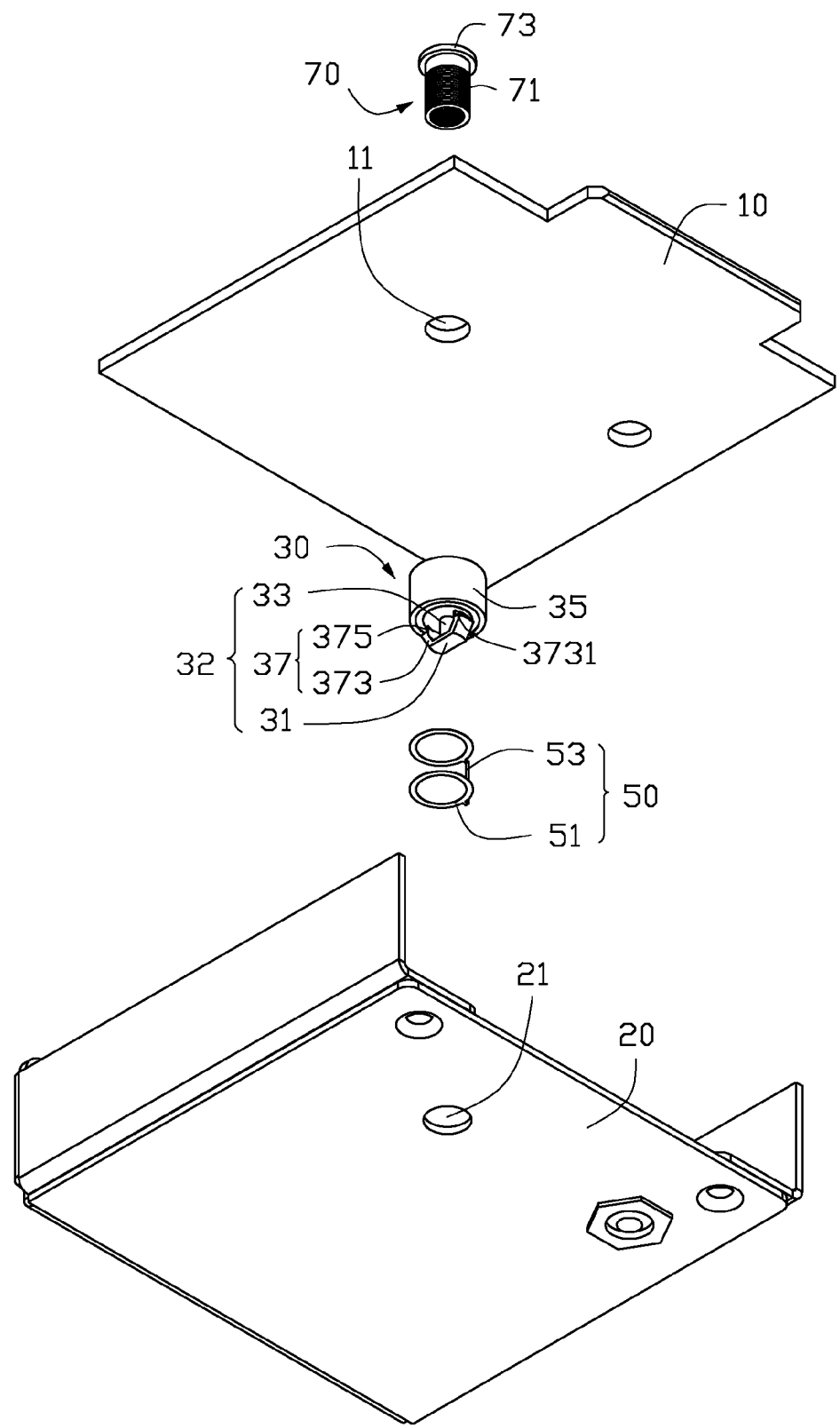
FIG. 2 is similar to FIG. 1, but viewed in a different aspect.

Referring to FIGS. 1-2, an electronic device in accordance with an embodiment includes a bottom plate 20 of a computer chassis, a circuit board 10, and a securing assembly to secure the circuit board 10 to the bottom plate 20.

The bottom plate 20 defines a plurality of through holes 21 (just one through hole 21 is shown in FIG. 1 and FIG. 2). The circuit board 10 defines a plurality of mounting holes 11 corresponding to the through holes 21. In one embodiment, the through holes 21 and the mounting holes 11 are round, and the circuit board 10 is a main board.

The securing assembly includes a positioning member 30, a linking member 50, and a locking member 70.

The positioning member 30 includes a maintaining portion 35 and a latching portion 32 connected to the maintaining portion 35. The maintaining portion 35 defines a threaded hole 355. In one embodiment, the maintaining portion 35 is circular, and the threaded hole 355 is round. The diameter of the threaded hole 355 is substantially equal to that of the mounting holes 11. A first receiving slot 351 is defined in each of a top surface and a bottom surface of the maintaining portion 35. A second receiving slot 353 is defined in a side of the maintaining portion 35. The second receiving slot 353 communicates with the two first receiving slots 351. The latching portion 32 includes a bottom end 31, a connecting post 33, and two elastically deformable latches 37. The connecting post 33 is connected between the bottom end 31 and the maintaining portion 35. Each latch 37 includes a positioning piece 373 and a blocking piece 375. The two positioning pieces 373 extend from two opposite side edges of the bottom end 31. An obtuse angle is defined between each positioning piece 373 and the bottom end 31. The connecting post 33 is located between the two latches 37. Each positioning piece 373 includes a blocking plane 3731. The blocking planes 3731 are substantially parallel to the bottom end 31. Each blocking piece 375 extends from a side edge of each blocking plane 3731, which is adjacent to the connecting post 33. In one embodiment, the blocking pieces 375 are substantially perpendicular to the bottom end 31. A gap is defined between each blocking piece 375 and the bottom surface of the maintaining portion 35. A distance between the two blocking pieces 375 is smaller than the diameter of the through hole 21. In one embodiment, the connecting post 33 is cylindrical.

Figure 3:
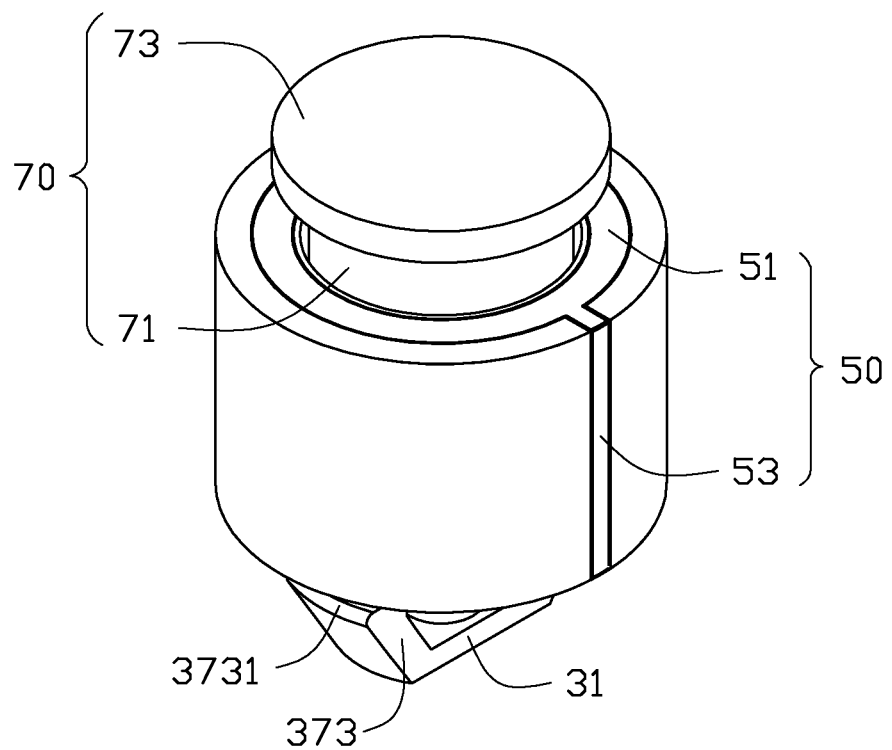
FIG. 3 is an assembled, isometric view of a securing assembly of FIG. 1.
Figure 4:
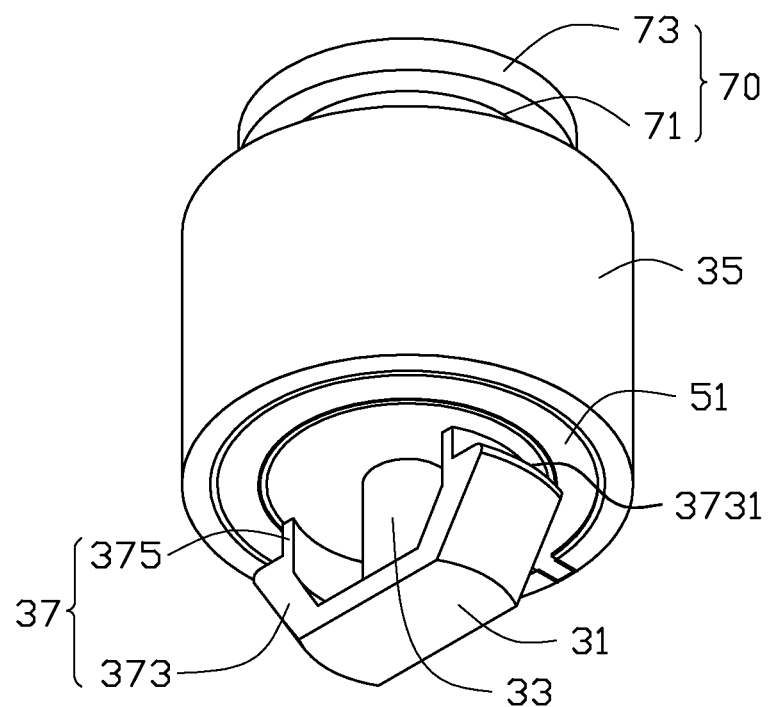
FIG. 4 is an assembled, isometric view of a securing assembly of FIG. 2.

Referring to FIG. 3 and FIG. 4, the linking member 50 includes two first linking pieces 51 and a second linking piece 53 connected to the two first linking pieces 51. In one embodiment, the two first linking pieces 51 are parallel to each other and substantially perpendicular to the second linking piece 53. The linking member 50 is secured to the positioning member 30. The two first linking pieces 51 are engaged in the two first receiving slots 351. The second linking piece 53 is engaged in the second receiving slot 353. The linking member 50 is composed of a conductive material, such as metal.

The locking member 70 includes a neck portion 71 and a head portion 73 connected to the neck portion 71. In one embodiment, the neck portion 71 and the head portion 73 are round. The diameter of the neck portion 71 is substantially equal to that of the through hole 21 and smaller than that of the head portion 73. The neck portion 71 corresponds to the threaded hole 355 of the maintaining portion 35 and is externally threaded.

Figure 5:
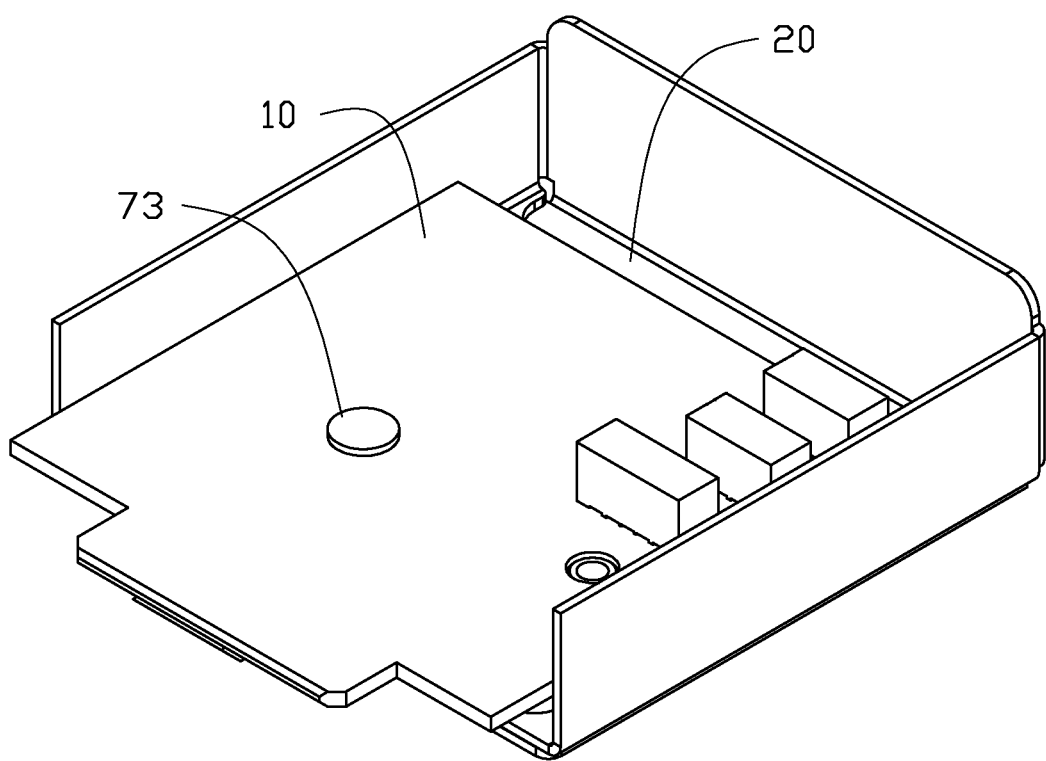
FIG. 5 is an assembled view of FIG. 1.
Figure 6:
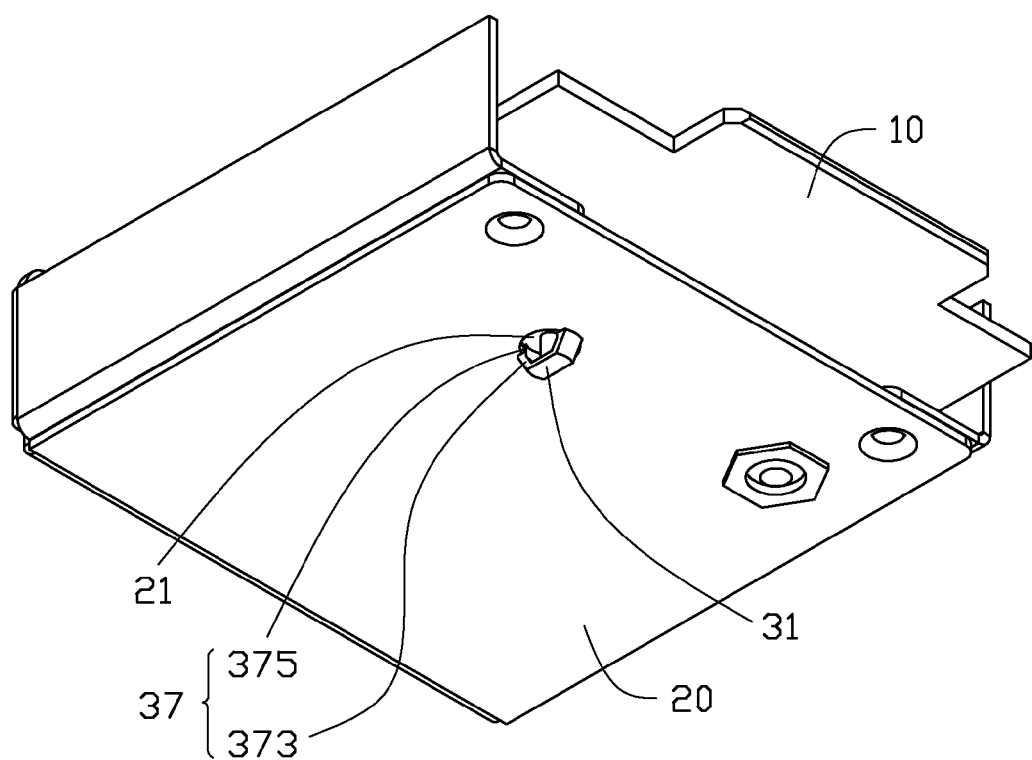
FIG. 6 is similar to FIG. 5, but viewed in a different aspect.

Referring also to FIGS. 5-6, in assembly, the positioning member 30 is moved until the bottom end 31 is aligned to the through hole 21. The bottom end 31 is inserted in the through hole 21, and the two latches 37 are blocked by the edges of through hole 21 and elastically deformed. The positioning member 30 is moved until the two positioning pieces 373 are exposed out of the bottom plate 20 from the through hole 21. In this position, the top surface of the bottom plate 20 abuts against the bottom surface of the maintaining portion 35 and the linking member 50. The two latches 37 elastically rebound to have the two blocking planes 3731 abut against the bottom surface of the bottom plate 20. Simultaneously, the two blocking pieces 375 are engaged in the through hole 21. Thus, the positioning member 30 is mounted on the bottom plate 20. Then, the circuit board 10 is moved to align the mounting hole 11 with the threaded hole 355 of the positioning member 30. The neck portion 71 of the locking member 70 is screwed into the threaded hole 355 through the mounting hole 11, until the head portion 73 abuts against the top surface of the circuit board 10. The bottom surface of the circuit board 10 abuts the top surface of the maintaining portion 35 and the linking member 50. The circuit board 10 is secured to the bottom plate 20 thereby. Because the linking member 50 is made of conductive material, the linking member 50 electronic connects the circuit board 10 and the bottom plate 20.

In disassembly, the locking member 70 is unscrewed from the positioning member 30, and the circuit board 10 can then be removed from the bottom plate 20. The two latches 37 are pressed to be elastically deformed, the positioning member 30 is pulled upwardly, the two latches 37 are passed out of the through hole 21. Then, the positioning member 30 can be removed from the bottom plate 20.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
   a bottom plate;
   a circuit board located on the bottom plate; and
   a mounting assembly comprising a positioning member, a locking member and a linking member; the positioning member is mounted to the bottom plate and located between the bottom plate and the circuit board; the locking member is locked to the positioning member to secure the circuit board between the locking member and the positioning member;
   wherein the linking member is located on the positioning member and connected to the circuit board and the bottom plate, to electronically connect the circuit board to the bottom plate;
   the positioning member comprises a maintaining portion mounted between the bottom plate and the circuit board; the maintaining portion comprises a top surface and a bottom surface opposite to the top surface, each of the top surface and the bottom surface defines a first receiving slot, and a second receiving slot is defined on a side of the maintaining portion; and the linking member comprises two first linking pieces and a second linking piece, the two first linking pieces are engaged in the first receiving slot of the top surface and the first receiving slot of the bottom surface, and the second linking piece is engaged in the second receiving slot.

2. The electronic device of claim 1, wherein the positioning member further comprises a latching portion connected to the maintaining portion, and the latching portion is engaged with the bottom plate.

3. The electronic device of claim 2, wherein the latching portion comprises a bottom end, a connecting post and two elastically deformable latches, the connecting post is connected between the maintaining portion and the bottom end, and the two elastically deformable latches extend from the bottom end and are engaged with the bottom plate.

4. The electronic device of claim 3, wherein each latch comprises a positioning piece, the positioning piece defines a blocking plane, and the blocking plane abuts a bottom surface of the bottom plate.

5. The electronic device of claim 4, wherein the positioning piece extends from the bottom end, and an angle defined between the positioning piece and the bottom end is obtuse.

6. The electronic device of claim 4, wherein the bottom plate defines a through hole, a blocking piece extends from each positioning piece, and the blocking piece is engaged in the through hole.

7. The electronic device of claim 6, wherein the blocking plane is substantially parallel to the bottom end, and the blocking piece is substantially perpendicular to the bottom end.

8. The electronic device of claim 1, wherein the second receiving slot communicates with the two first receiving slots, and the second linking piece is connected to the two first linking pieces.

9. The electronic device of claim 1, wherein the two first linking pieces are substantially parallel to each other.

10. An electronic device comprising:
    a bottom plate;
    a circuit board located on the bottom plate; and
    a mounting assembly comprising a positioning member, a locking member and a linking member; the positioning member mounted to the bottom plate, and located between the bottom plate and the circuit board; the locking member locked to the positioning member, to secure the circuit board to the bottom plate;
    wherein the positioning member comprises a latching portion and a maintaining portion connected to the latching portion, and the latching portion is engaged with the bottom plate; the maintaining portion comprises a top surface and a bottom surface opposite to the top surface; the linking member comprises two first linking pieces and a second linking piece, the two first linking pieces are engaged with the top surface and the bottom surface, and second linking pieces is engaged in a side of the maintaining portion; the two first linking pieces connected between the circuit board and the bottom plate, to electronically connect the circuit board to the bottom plate; each of the top surface and the bottom surface defines a first receiving slot, and a second receiving slot is defined on a side of the maintaining portion; the two first linking pieces are engaged in the first receiving slot of the top surface and the first receiving slot of the bottom surface, and the second linking piece is engaged in the second receiving slot.

11. The electronic device of claim 10, wherein the second linking piece is connected to the two first linking pieces.

12. The electronic device of claim 10, wherein the second receiving slot communicates with the two first receiving slots.

13. The electronic device of claim 10, wherein the two first linking pieces are substantially parallel to each other.

14. The electronic device of claim 10, wherein the latching portion comprises a bottom end, a connecting post and two elastically deformable latches, the connecting post is connected between the maintaining portion and the bottom end, the two elastically deformable latches extend from the bottom end are engaged with the bottom plate.

15. The electronic device of claim 14, wherein each latch comprises a positioning piece, the positioning piece defines a blocking plane, the blocking plane abuts the bottom plate.

16. The electronic device of claim 15, wherein the positioning piece extends from the bottom end, and an angle defined between the positioning piece and the bottom end is obtuse.

17. The electronic device of claim 15, wherein the bottom plate defines a through hole, a blocking piece extends from each positioning piece, and the blocking piece is engaged in the through hole.

18. The electronic device of claim 17, wherein the blocking plane is substantially parallel to the bottom end, and the blocking piece is substantially perpendicular to the bottom end.

* * * * *